(12) United States Patent
Kawasaki et al.

(10) Patent No.: US 9,668,358 B2
(45) Date of Patent: *May 30, 2017

(54) CU BALL

(71) Applicant: Senju Metal Industry Co., Ltd., Tokyo (JP)

(72) Inventors: Hiroyoshi Kawasaki, Tochigi-ken (JP); Takahiro Hattori, Tochigi-ken (JP); Takahiro Roppongi, Tochigi-ken (JP); Daisuke Soma, Tochigi-ken (JP); Isamu Sato, Saitama-ken (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/649,439

(22) PCT Filed: Dec. 6, 2012

(86) PCT No.: PCT/JP2012/081622
§ 371 (c)(1),
(2) Date: Jun. 3, 2015

(87) PCT Pub. No.: WO2014/087514
PCT Pub. Date: Jun. 12, 2014

(65) Prior Publication Data
US 2015/0313025 A1   Oct. 29, 2015

(51) Int. Cl.
*C22C 9/00* (2006.01)
*B23K 35/30* (2006.01)
(Continued)

(52) U.S. Cl.
CPC ......... *H05K 3/3484* (2013.01); *B22F 1/0007* (2013.01); *B22F 1/0048* (2013.01);
(Continued)

(58) Field of Classification Search
CPC .... B22F 1/0003; B22F 1/0007; B22F 1/0011; B22F 1/0048; B22F 2301/10;
(Continued)

(56) References Cited

U.S. PATENT DOCUMENTS

2004/0177997 A1*  9/2004  Hata ................... H01L 21/4853
174/257
2014/0010705 A1*  1/2014  Kanou .................... C22C 9/00
420/491

FOREIGN PATENT DOCUMENTS

JP          06168974 A  *  6/1994
JP          2005-002428       1/2005
(Continued)

OTHER PUBLICATIONS

International Search Report from priority PCT application No. PCT/JP2012/081622, date of mailing Feb. 12, 2013, 2 pgs, English translation only.
(Continued)

*Primary Examiner* — Scott Kastler
*Assistant Examiner* — Vanessa Luk
(74) *Attorney, Agent, or Firm* — Chernoff Vilhauer, McClung & Stenzel, LLP

(57) ABSTRACT

A Cu ball that has low α dose and high sphericity even when containing at least a certain amount of impurity elements other than Cu. Even when the purity thereof is 99.995% or less and U and Th contents are 5 ppb or less in order to suppress any software errors and decrease connection failure, α dose is 0.0200 cph/cm$^2$ or less. Further, the sphericity of the Cu ball is unexpectedly improved by making the purity not more than 99.995%.

13 Claims, 2 Drawing Sheets

(51) Int. Cl.
*H05K 3/34* (2006.01)
*B22F 1/02* (2006.01)
*B22F 1/00* (2006.01)
*B23K 35/02* (2006.01)
*H01L 23/488* (2006.01)
*H01L 23/498* (2006.01)

(52) U.S. Cl.
CPC ............ *B22F 1/02* (2013.01); *B23K 35/0222* (2013.01); *B23K 35/0244* (2013.01); *B23K 35/302* (2013.01); *C22C 9/00* (2013.01); *H01L 23/488* (2013.01); *H01L 23/49816* (2013.01); *H01L 2924/0002* (2013.01); *H05K 3/3463* (2013.01); *H05K 2203/041* (2013.01)

(58) Field of Classification Search
CPC ............... B22F 2304/10; C22F 1/08; H05K 2201/10234; H05K 2201/10734; H05K 2203/041; H05K 2203/0435; B23K 35/0222; B23K 35/0227; B23K 35/0233; B23K 35/0238; B23K 35/0244; B23K 35/025; B23K 35/302
See application file for complete search history.

(56) References Cited

FOREIGN PATENT DOCUMENTS

| | | | |
|---|---|---|---|
| JP | 2005-036301 | | 2/2005 |
| JP | 2005036301 A | * | 2/2005 |
| JP | 2010-099694 A | | 5/2010 |
| JP | 2011-029395 | | 2/2011 |
| JP | 2011-114824 | | 6/2011 |
| JP | 2011-214061 | | 10/2011 |
| WO | 95/24113 | | 9/1995 |
| WO | 2011/114824 | | 9/2011 |
| WO | 2012/120982 | | 9/2012 |

OTHER PUBLICATIONS

Office Action from the Korean Intellectual Property Office for KR 10-2015-7017867 mailed Sep. 4, 2015 (including English translation), 11 pages.

* cited by examiner

US 9,668,358 B2

CU BALL

This is a national stage application filed under 35 USC 371 based on International Application No. PCT/JP2012/081622, filed Dec. 6, 2012.

TECHNICAL FIELD

The present invention relates to Cu ball having less α dose.

BACKGROUND

Development of small information equipment has been rapidly advanced miniaturization of its electronic components mounted thereon in recent years. Ball grid allay (hereinafter, referred to as "BGA") has been applied to the electronic components so that electrodes are arranged on a rear surface thereof, in order to cope with narrowing of the terminals and/or reduced size of mounting area according to downsizing requirement.

As the electronic component to which BGA is applied, a semiconductor package is exemplified. In the semiconductor package, a semiconductor chip having electrodes is sealed by any resins. On the electrodes of the semiconductor chip, solder bumps are formed. Each solder bump is formed by connecting a solder ball with the electrode of the semiconductor chip. The semiconductor package to which BGA is applied is mounted on a printed circuit board by putting each solder bump on the printed circuit board so that each solder bump can contact an electrically conductive land of the printed circuit board and connecting the solder bump fused by heating with the land. Further, in order to cope with any higher density mounting requirement, a three dimensional high density mounting structure in which the semiconductor packages are piled along a height direction thereof has been studied.

However, when BGA is applied to the semiconductor packages on which the three dimensional high density mounting is performed, each ball becomes flat by weight of the semiconductor packages, which causes a short-circuit between the electrodes. This constitutes any hindrance to the high density mounting performance.

Accordingly, a solder bump in which Cu ball is connected to an electrode of an electronic component through paste has been studied. The solder bump having the Cu ball can support the semiconductor package by the Cu ball which does not melt at a melting point of the solder when mounting the electronic component on the printed circuit board even if the weight of the semiconductor packages is applied to the solder bump. Therefore, it is impossible for the solder bump to become flat by the weight of the semiconductor packages. As a related art, patent document 1 is exemplified.

By the way, the miniaturization of electronic components allows the high density mounting structure but such high density mounting structure has caused any software errors. These software errors may occur by rewriting contents stored in a memory cell of a semiconductor integrated circuit (hereinafter, referred to as "IC") when entering α ray into the memory cell. It is considered that the α ray radiates by α decay of a radioactive isotope such as U, Th and $^{210}$Po in a solder alloy. Accordingly, a solder material decreasing radioactive isotope content and having less α ray has been developed in recent years.

For this reason, the Cu ball disclosed in the patent document 1 is also required to decrease any software errors occurred in the high density mounting structure.

DOCUMENT FOR PRIOR ART

Patent Document

Patent Document 1: International Publication No. 95/24113

SUMMARY OF THE INVENTION

Problem to be Solved by the Invention

Any α ray on the Cu ball has been not previously considered. For this reason, such a problem that after soldering the Cu ball, the α ray radiates together with diffusion of the radioactive isotope from the Cu ball so that the α ray radiated from the Cu ball enters into the memory cell of the semiconductor chip, thereby causing any software errors, has not yet solved.

Although it is thus also necessary to decrease the α ray in a soldered portion using the Cu ball, any α ray on the Cu ball has been not previously considered, including the patent document 1, This is considered because the radioactive isotope such as $^{210}$Po radiating the α ray evaporates since there is a step where Cu is heated up to about 1000 degrees C. in a conventional smelting process of the Cu, so that any software errors are not caused by the α ray of the Cu. This is also considered because it seems that the content of the radioactive isotope is sufficiently decreased, by taking it into consideration that when manufacturing the Cu ball, the Cu is heated at about 1000 degrees C. and fused.

However, under any conventional manufacturing conditions of the Cu ball, it has not been testified that the α ray from the Cu ball is decreased to an order such that any software errors do not occur. A melting point of $^{210}$Po is of 962 degrees C. and it has been thinkable that by the smelting process at about 1000 degrees C., this sufficiently evaporates up to an order such that any software errors do not occur. Since, however, the conventional smelting process of Cu has not an object to evaporate $^{210}$Po, $^{210}$Po is not always sufficiently decreased at this temperature. It has been not certain to obtain the Cu ball having less α ray by the conventional Cu-ball manufacture.

Here, it is conceivable that the Cu ball is manufactured using a high purity Cu material, but it is unnecessary to decrease content of element(s) which is (are) not concerned in α dose of the Cu ball. When using high purity Cu material indiscriminately, costs may be merely increased.

Further, when the Cu ball has less sphericity, such Cu ball does not fully exhibit any original function to control a stand-off height in a moment of forming the solder bumps. Here, the sphericity indicates what degree the ball is closed to a complete sphericity of the ball, Therefore, the bumps having uneven heights are formed, which causes any problem when mounting. Form the above-mentioned backgrounds, the Cu ball having higher sphericity has been desired.

This invention has a problem to provide Cu ball that has less α dose and high sphericity even when containing at least a certain amount of impurity elements other than Cu.

Means for Solving the Problems

The inventors have found out that even when a Cu material on the market has a purity of 99.9% through 99.99% (hereinafter, a purity of 99% is referred to as "2N"; a purity of 99.9% is referred to as "3N"; a purity of 99.99% is referred to as "4N"; a purity of 99.999% is referred to as "5N"; and a purity of 99.9999% is referred to as "6N"), U or Th decreases below 5 ppb. Further, the inventors have paid attention to that a cause of the software errors is $^{210}$Po which remains at such a very small content that cannot be qualitatively measured. Additionally, the inventors have found out that by performing a heating process on the Cu ball when manufacturing the Cu ball, fixing a temperature of fused Cu high, and/or performing a heating process on granulated Cu ball, the α dose of Cu ball is limited to α dose that is not more than 0.0200 cph/cm$^2$ even if the Cu ball has a purity of 99.995% (hereinafter, referred to as "4N5").

The inventors have also found out that in order to increase the sphericity of the Cu ball, it is required that the Cu ball has a purity of 4N5 or less, namely, elements (hereinafter, suitably referred to as "impurity elements") other than Cu are contained in the Cu ball at a total amount of 50 ppm or more and have completed the invention.

Here, this invention will be described as follows:

(1) A Cu ball contains a purity of 99.995% or less, α dose of 0.0200 cph/cm$^2$ or less, U content of 5 ppb or less and Th content of 5 ppb or less.

(3) In the Cu ball described in the above-mentioned item (1), the α dose is 0.0020 cph/cm$^2$ or less.

(3) In the Cu ball described in either of the above-mentioned items (1) or (2), the α dose is 0.0010 cph/cm$^2$ or less.

(4) The Cu ball described in any one of the above-mentioned items (1) through (3) has a diameter in the range of 1 μm to 1000 μm.

(5) A Cu core ball is characterized in that the Cu core ball includes the Cu ball according to any one of the above-mentioned items (1) through (4) and solder plating which covers the Cu ball.

(6) A Cu core ball is characterized in that the Cu core ball includes the Cu ball according to any one of the above-mentioned items (1) through (4), Ni plating which covers the Cu ball and solder plating which covers the Ni plating.

(7) A solder joint uses the Cu ball according to any one of the above-mentioned items (1) through (4).

(8) A solder joint uses the Cu core ball described in one of the above-mentioned items (5) or (6).

MODE FOR IMPLEMENTING THE INVENTION

Figure 1:
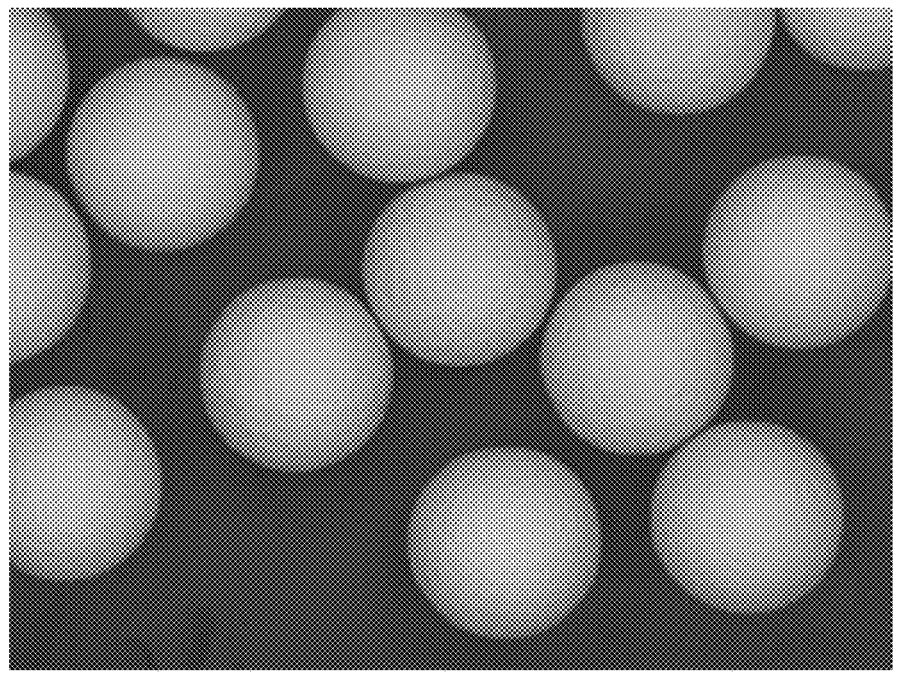
FIG. 1 is a SEM photograph of Cu balls according to an embodiment 1.

The following will describe this invention more in detail. In this description, units (such as ppm, ppb and %) relating to composition of the Cu ball represent ratios to mass of the Cu ball (for example, mass ppm, mass ppb and mass %) unless otherwise specified.

U: 5 ppb or Less/Th: 5 ppb or Less

U and Th are radioactive isotopes so that it is required to limit their contents in order to suppress any software errors. The U and Th contents are respectively required to be 5 ppb or less so that the α dose of the Cu ball is 0.0200 cph/cm$^2$ or less. Further, preferably, the U and Th contents are respectively 2 ppb or less from a viewpoint of suppressing the software errors in the present or future high density mounting structure.

Purity of Cu Ball: 99.995% or Less

The Cu ball according to this invention has a purity of 4N5 or less. In other words, the Cu ball according to this invention contains impurity elements of 50 ppm or more. When the purity of Cu constituting the Cu ball stays within this range, it is possible to maintain a sufficient amount of crystal core in the fused Cu so that the sphericity of the Cu ball is increased. The reason why the sphericity of the Cu ball is increased will be described more in detail as follows:

When manufacturing the Cu ball, chips of Cu material each being formed so as to have a predetermined shape are fused by heating them and then, the fused Cu is made spherical by its surface tension. This is then solidified so as to be the Cu ball. During a process from a liquid state of the fused Cu to the solidifying state thereof, the crystal grain grows spherically in the fused Cu. In this moment, when there are many impurity elements, these impurity elements become crystal cores so that they inhibit the crystal grain from growing. Therefore, spherical fused Cu becomes a Cu ball having high sphericity by growth-inhibited and refined crystal grains. On the other hand, when there are few impurity elements, the crystal grain grows with an orientation without inhibiting the crystal grain from growing because there are relatively few crystal cores. As a result thereof, the spherical fused Cu is solidified with a part of the surface thereof being projected. Such Cu ball has less sphericity. As the impurity elements, Sn, Sb, Bi, Zn, As, Ag, Cd, Ni, Pb, Au, P, S, U, Th and the like are conceivable.

Although a lower limit of the purity is not specifically fixed, it is preferable that this is 3N or more, from a viewpoint of controlling the α dose and preventing electro-conductivity and/or thermal conductivity of the Cu ball from being deteriorated because of less purity thereof. Namely, the content of the impurity elements in the Cu ball excluding Cu is preferably 1000 ppm or less.

α Dose: 0.0200 cph/cm$^2$ or Less

The Cu ball according to this invention has α dose of 0.0200 cph/cm$^2$ or less. This is the α dose such that it does not cause any software errors in the high density mounting structure of the electronic components. In this invention, heating process is again performed on the Cu ball when manufacturing it in addition to the normal manufacturing steps. Therefore, $^{210}$Po remained at a very small amount in the Cu material evaporates, so that the Cu ball represents the α dose that is still less than that of the Cu material. From a viewpoint of suppressing any software errors in the higher density mounting structure, it is preferable that the α dose is 0.0020 cph/cm$^2$ or less. It is much preferable that the α dose is 0.0010 cph/cm$^2$ or less.

The following will describe preferable embodiments.

Pb and/or Bi Contents of a Total of 1 ppm or More

Although, as the impurity elements, Sn, Sb, Bi, Zn, As, Ag, Cd, Ni, Pb, Au, P, S, U, Th and the like are conceivable, it is preferable that the Cu ball according to the invention contains particularly Pb and Bi among the impurity elements of a total of 1 ppm or more. It is not required in this invention to decrease Pb and/or Bi contents up to their limits, when decreasing the α dose. This is based on the following reasons:

$^{210}$Pb and $^{210}$Bi change into $^{210}$Po through β-decay. Thus, in order to decrease the α dose, it is considered to be preferable that the contents of Pb and/or Bi as the impurity elements are as little as possible.

However, a content ratio of 210Pb and 210Bi contained in Pb and Bi is low. It is conceivable that 210Pb and 210Bi are almost removed when a certain amount of Pb and Bi contents is decreased. The Cu ball according to this invention is manufactured by setting a melting temperature of Cu at slightly higher temperature than the conventional one or performing a heating process on the Cu material and/or granulated Cu ball. This temperature is lower than boiling point of Pb or Bi but evaporation may be taking place even when the temperature is lower than the boiling point thereof, so that the impurity elements decrease. Further, in order to increase the sphericity of the Cu ball, it is desirable to increase the contents of the impurity elements. Therefore, it is preferable that the Cu ball according to this invention has Pb and/or Bi contents of 1 ppm or more in total.

Further, normally, the Pb and/or Bi contents of Cu material are 1 ppm or more in total. As described above, since the Cu ball according to this invention may remove 210Pb and 210Bi, it is not heated to a temperature more than the boiling points of Pb and Bi. In other words, a large amount of the contents of Pb and Bi does not decrease. Thus, since amounts of Pb and Bi remain in the Cu ball to some extent after it is manufactured, a measurement error in contents thereof is limited. Accordingly, Pb and Bi are important elements for estimating contents of the impurity elements. From such a viewpoint, it is also preferable that the Pb and/or Bi contents are 1 ppm or more in total. It is very preferable that the Pb and/or Bi contents are 10 ppm or more in total. Although an upper limit thereof is not specifically fixed, it is more preferable that the Pb and/or Bi contents are less than 1000 ppm in total, from a viewpoint of preventing the electroconductivity of the Cu ball from being deteriorated.

Sphericity of Cu Ball: 0.95 or more

A configuration of the Cu ball according to this invention is preferable so that the sphericity thereof is 0.95 or more from a viewpoint of controlling the stand-off height. When the sphericity of Cu ball is less than 0.95, the Cu ball has an indeterminate configuration. The bump having uneven height is formed when forming the bump, so that there may be a strong possibility that any connection failure occurs. It is more preferable that the sphericity is 0.990 or more. In this invention, a deviation from a complete sphericity of the ball is referred to as the "sphericity". The sphericity is obtained by various kinds of methods such as a least square center (LSC) method, a minimum zone center (MZC) method, a maximum inscribed circle (MIC) method, a minimum circumscribing circle (MCC) method and the like.

Diameter of Cu Ball: 1 µm Through 1000 µm

It is preferable that the Cu ball according to this invention has a diameter of 1 µm through 1000 µm. When it is within this range, it is possible to manufacture the spherical Cu ball stably and inhibit the terminals from being short-circuited when these terminals are narrow pitch terminals. Here, when the Cu ball according to this invention is used with paste, the Cu ball may be referred as to "Cu powder". When the Cu ball is referred as to the Cu powder, the Cu ball generally has a diameter of 1 µm through 300 µm.

The following will describe an example of a method of manufacturing the Cu ball according to this invention.

The Cu material as material is put on a plate having heat-resisting property (hereinafter, referred to as "heat-resisting plate") such as ceramics and is heated in a furnace together with the heat-resisting plate. There are many dimples each having a hemispheric bottom in the heat-resisting plate. A diameter of the dimple and a depth thereof are suitably set according to a diameter of the Cu ball. For example, the diameter thereof is 0.8 mm and the depth thereof is 0.88 mm. Further, the Cu materials each having a chip shape (hereinafter, referred to as "chip material"), which are obtained by cutting a fine wire made of Cu, are put into the dimples one by one in the heat-resisting plate. The heat-resisting plate in which the chip material have been put into each of the dimples is heated up to 1100 through 1300 degrees C. in the furnace into which ammonia decomposition gas is filled and heating process is performed thereon during 30 through 60 minutes. In this moment, when temperature in the furnace is more than the melting point of Cu, the chip material is fused so that it becomes sphered. Thereafter, the interior of the furnace is cooled so that the Cu ball is formed in each of the dimples of the heat-resisting plate. After the cooling, the formed Cu ball is again heated at the temperature of 800 through 1000 degrees C. which is a temperature that is less than the melting point of Cu.

Further, as other methods, there are an atomizing method in which the fused Cu is dropped down from an orifice pierced through a bottom of a melting pot and the droplet is cooled to be granulated as the Cu ball and a granulation method in which thermal plasma heats cut metal of Cu at a temperature of 1000 degrees C. or more. The Cu balls thus granulated may be again heated respectively at a temperature of 800 through 1000 degrees C. during 30 through 60 minutes.

In these methods of manufacturing the Cu ball, the Cu material may be heated at a temperature of 800 through 1000 degrees C. before it is granulated as the Cu ball.

As the Cu material that is a raw material of the Cu ball, for example, pellet, wire, pillar or the like can be used. The Cu material may have a purity of 2N through 4N from a viewpoint such that the purity of the Cu ball does not too decrease.

In a case where the Cu material having such a high purity is used, a temperature for maintaining the fused Cu may decrease to a temperature of about 1000 degrees C., which is similar to a conventional one, without performing the above-mentioned heating process. Accordingly, the above-mentioned heating process may be suitably omitted or changed according to the purity of the Cu material and/or the α dose thereof. When manufacturing the Cu balls having high α dose or having no spherical shape, these Cu balls can be reused as a raw material, so that the α dose can be decreased.

The invention may be also applied to a Cu column or a Cu pillar. Moreover, the Cu ball according to the invention can be applied to a so-called Cu core ball in which the Cu ball of this invention is configured to be as a core and various kinds of solder plating are performed on a surface thereof. Further, the Cu core ball in which after Ni plating is performed a surface of the Cu ball, solder plating is covered thereon can suppress thinning of copper. The Cu ball and the Cu core ball according to the invention can be used as a solder joint of an electronic component.

EMBODIMENTS

The following will describe embodiments of the invention, but the invention is not limited thereto.

Embodiment 1

Cu pellets (α dose is 0.0031 cph/cm$^2$, U is 1.5 ppb and Th is less than 5 ppb) each having a purity of 3N were put into the melting pot and preliminary heating was performed thereon under a thermal condition of 900 degrees C. during 45 minutes. The melting pot was then heated up to a temperature of 1200 degrees C. and this heating process was performed thereon during 45 minutes. The fused Cu was dropped down from an orifice pierced through the bottom of the melting pot and the droplet was cooled so as to be granulated as the Cu ball. Thus, the Cu balls having a mean diameter of 275 μm were manufactured. A table 1 shows a result of an elementary analysis, α dose and sphericity of the manufactured Cu balls. The following will describe a method of measuring the α dose and sphericity more in detail.

α Dose

The α dose was measured using α dose measurement equipment of a gas flow type proportional counter. A measurement sample was a 300×300 mm flat shallow container with the Cu balls spreading all over it. This measurement sample was put into the α dose measurement equipment and the α dose was measured under PR-10 gas flow. The PR-10 gas (90% of argon and 10% of methane) used in the measurement was the gas after more than three weeks was elapsed since the gas was filled in a gas bomb. It complied with a guideline of the method of measuring the α dose, which was prescribed by joint electron device engineering council (JEDEC), that the bomb was used after more than three weeks was elapsed, so that α ray did not occur by radon in the atmosphere, which might be inserted into the gas bomb.

Sphericity

The sphericity was measured by CNC image measurement system. Equipment therefor was ultra quick vision, ULTRA QV350-PRO manufactured by MITSUTOYO Corporation.

FIG. 1 shows SEM photograph of the manufactured Cu balls. The magnification of the SEM photograph is 100 times.

Embodiment 2

Figure 2:
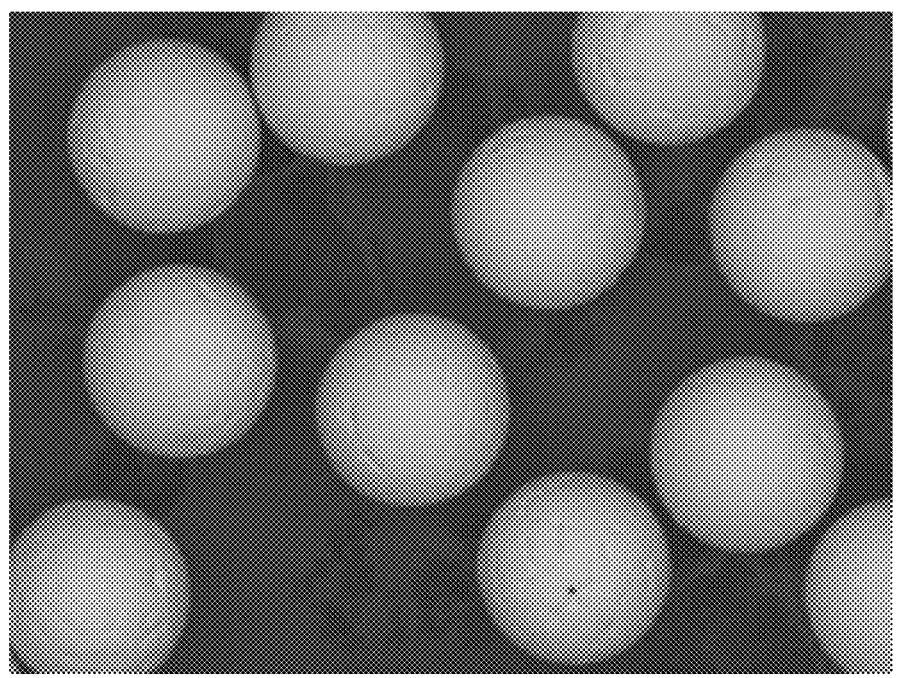
FIG. 2 is a SEM photograph of Cu balls according to an embodiment 2.

The Cu balls were manufactured similar to those of the embodiment 1 except using Cu wire (α dose is 0.0026 cph/cm$^2$, U is less than 0.5 ppb or less and Th is less than 0.5 ppb) having a purity of 4N5 or less. An elementary analysis was performed and the α dose was measured. The table 1 shows a result thereof. FIG. 2 shows SEM photograph of the manufactured Cu balls in the embodiment 2. The magnification of the SEM photograph is 100 times.

Comparison Example 1

Figure 3:
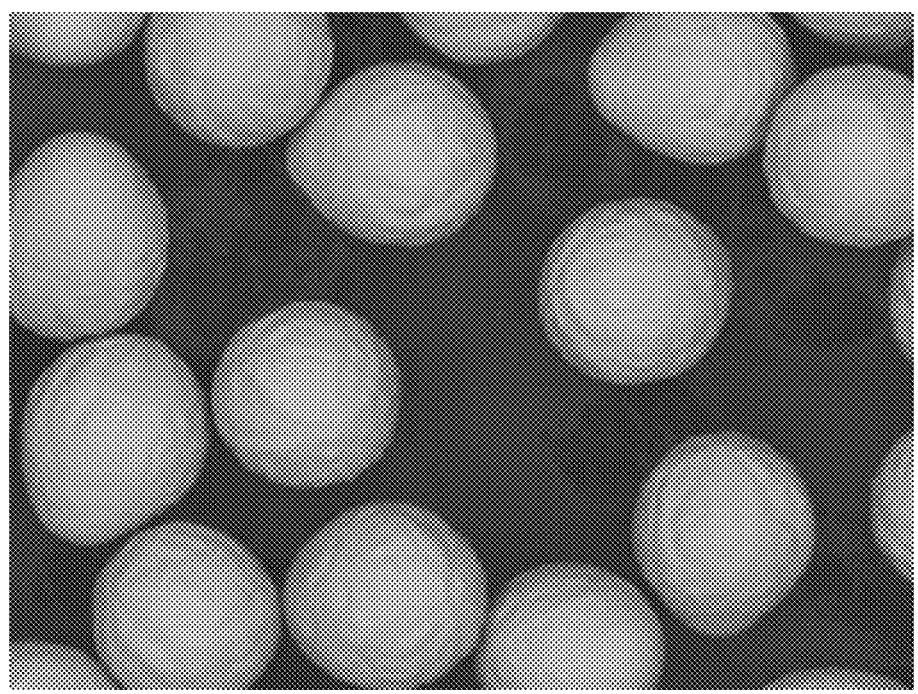
FIG. 3 is a SEM photograph of Cu balls according to a comparison example 1.

The Cu balls were manufactured similar to those of the embodiment 1 except using Cu plate (α dose is less than 0.0010 cph/cm$^2$, U is 5 ppb or less and Th is 5 ppb or less) having a purity of 6N that is higher than 4N5. An elementary analysis was performed and the α dose was measured. The table 1 shows a result thereof. FIG. 3 shows SEM photograph of the manufactured Cu balls in the comparison example 1. The magnification of the SEM photograph is 100 times.

As shown in the table 1, nevertheless the Cu balls of the embodiments 1 and 2 had a purity of 4N5 or less and contents of Bi and Pb of 10 ppm or more, their α dose was less than 0.0010 cph/cm$^2$. Since the Cu balls of the comparison example 1 had a purity that was higher than 4N5, of course, its α dose was less than 0.0010 cph/cm$^2$. The α dose of the Cu balls of the embodiments 1 and 2 was less than 0.0010 cph/cm$^2$ for at least four years. Therefore, the Cu balls of the embodiments 1 and 2 have also solved such a recent problem that the α dose increases due to secular change.

As shown in FIGS. 1 and 2, since the Cu balls of the embodiments 1 and 2 had a purity of 4N5 or less (namely, the contents of elements other than Cu are 50 ppm or more), the sphericities of both were 0.95 or more. On the other hand, as shown in FIG. 3, the Cu balls of the comparison example 1 had a purity of more than 4N5 (namely, the contents of elements other than Cu are less than 50 ppm), its sphericity was below 0.95.

The invention claimed is:

1. A Cu ball characterized in that the Cu ball contains a Pb content of 1 ppm or more, and has a sphericity of 0.95 or more, a purity from 99.9% or more to 99.995% or less, an α dose of 0.0200 cph/cm$^2$ or less, a U content of 5 ppb or less, a Th content of 5 ppb or less, and a diameter in the range of 1 μm through 1000 μm.

2. The Cu ball according to claim 1 wherein the α dose is 0.0020 cph/cm2 or less.

3. The Cu ball according to claim 1 wherein the α dose is 0.0010 cph/cm2 or less.

4. A Cu core ball including:
the Cu ball according to claim 1, and
solder plating which covers the Cu ball.

5. A Cu core ball including:
the Cu ball according to claim 2, and
solder plating which covers the Cu ball.

6. A Cu core ball including:
the Cu ball according to claim 1,
Ni plating which covers the Cu ball; and
solder plating which covers the Ni plating.

7. A Cu core ball including:
the Cu ball according to claim 2,
Ni plating which covers the Cu ball; and
solder plating which covers the Ni plating.

8. A solder joint using, the Cu ball according to claim 1.

9. A solder joint using the Cu ball according to claim 2.

10. A solder joint using the Cu core ball according to claim 4.

11. A solder joint using the Cu core ball according to claim 5.

TABLE 1

| | ALLOY COMPOSITION | | | | | | | | | | | | | | α DOSE | |
|---|---|---|---|---|---|---|---|---|---|---|---|---|---|---|---|---|
| | Cu | Sn | Sb | Bi | Zn | As | Ag | Cd | Ni | Pb | Au | P | S | U | Th | (cph/cm$^2$) | SPHERICITY |
| EMBODIMENT 1 | bal. | 84 | 21 | 32 | 3 | 49 | 20 | 7 | 4 | 16 | 4 | 200 | 18 | 1.5 | <0.5 | <0.0010 | 0.9932 |
| EMBODIMENT 2 | bal. | 8 | 10 | 19 | — | 24 | 13 | — | 1 | 8 | — | — | — | <0.5 | <0.5 | <0.0010 | 0.9931 |
| COMPARISON EXAMPLE 1 | bal. | 13 | 2 | 18 | — | 10 | — | — | 1 | 3 | — | — | — | 0.9 | <0.5 | <0.0010 | 0.9227 |

*U and Th are represented by mass ppb. Other elements are represented by mass ppm.

12. A solder joint using the Cu core ball according to claim 6.

13. A solder joint using the Cu core ball according to claim 7.

* * * * *

UNITED STATES PATENT AND TRADEMARK OFFICE
CERTIFICATE OF CORRECTION

| | | |
|---|---|---|
| PATENT NO. | : 9,668,358 B2 | Page 1 of 1 |
| APPLICATION NO. | : 14/649439 | |
| DATED | : May 30, 2017 | |
| INVENTOR(S) | : Hiroyoshi Kawasaki et al. | |

It is certified that error appears in the above-identified patent and that said Letters Patent is hereby corrected as shown below:

In the Specification

In Column 8, Line 29, "cm2" should read --$cm^2$--.

In Column 8, Line 31, "cm2" should read --$cm^2$--.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*